United States Patent
Fritz et al.

(10) Patent No.: US 10,267,878 B2
(45) Date of Patent: Apr. 23, 2019

(54) METHOD AND APPARATUS FOR RECORDING A MAGNETIC RESONANCE DATASET OF AT LEAST ONE FOREIGN BODY IN A PATIENT

(71) Applicants: Siemens Aktiengesellschaft, Munich (DE); The Johns Hopkins University, Baltimore, MD (US)

(72) Inventors: Jan Fritz, Baltimore, MD (US); David Grodzki, Erlangen (DE); Heiko Meyer, Uttenreuth (DE); Mathias Nittka, Baiersdorf (DE)

(73) Assignees: Siemens Aktiengesellschaft, Munich (DE); The John Hopkins University, Baltimore, MD (US)

( * ) Notice: Subject to any disclaimer, the term of this patent is extended or adjusted under 35 U.S.C. 154(b) by 856 days.

(21) Appl. No.: 14/813,535

(22) Filed: Jul. 30, 2015

(65) Prior Publication Data

US 2016/0033602 A1 Feb. 4, 2016

(30) Foreign Application Priority Data

Jul. 30, 2014 (DE) .................. 10 2014 214 992

(51) Int. Cl.
*G01R 33/48* (2006.01)
*G01R 33/50* (2006.01)
*G01R 33/56* (2006.01)
*G01R 33/565* (2006.01)

(52) U.S. Cl.
CPC .......... *G01R 33/4816* (2013.01); *G01R 33/50* (2013.01); *G01R 33/5608* (2013.01); *G01R 33/56536* (2013.01)

(58) Field of Classification Search
CPC ................ G01R 33/4816; G01R 33/50; G01R 33/5608; G01R 33/56536
See application file for complete search history.

(56) References Cited

U.S. PATENT DOCUMENTS

| 6,418,335 | B2 * | 7/2002 | Avrin | A61B 5/04005 324/207.21 |
| 6,549,007 | B1 * | 4/2003 | Hills | G01R 33/307 324/303 |
| 8,908,949 | B2 * | 12/2014 | Asiyanbola | A61B 6/12 382/130 |
| 2002/0077537 | A1 * | 6/2002 | Avrin | A61B 5/04005 600/409 |
| 2002/0115925 | A1 * | 8/2002 | Avrin | A61B 5/04005 600/407 |
| 2010/0253338 | A1 * | 10/2010 | Eryaman | G01R 33/285 324/309 |

(Continued)

OTHER PUBLICATIONS

Grodzki et al; "Ultrashort Echo Time Imaging Using Pointwise Encoding Time Reduction With Radial Acquisition (PETRA)"; Magnetic Resonance in Medicine; vol. 67; pp. 510-518; (2012).

(Continued)

*Primary Examiner* — Dixomara Vargas
(74) *Attorney, Agent, or Firm* — Schiff Hardin LLP

(57) ABSTRACT

In a method and apparatus for recording a magnetic resonance dataset of at least one foreign body in a target region of a patient, a magnetic resonance sequence having an ultra-short echo time, which is less than 500 μs is used for recording the magnetic resonance data.

19 Claims, 2 Drawing Sheets

(56) References Cited

U.S. PATENT DOCUMENTS

| | | | |
|---|---|---|---|
| 2012/0074941 A1* | 3/2012 | Grodzki | G01R 33/4816 |
| | | | 324/314 |
| 2012/0076383 A1 | 3/2012 | Grodzki | |
| 2013/0136323 A1* | 5/2013 | Asiyanbola | A61B 6/12 |
| | | | 382/128 |
| 2013/0169273 A1* | 7/2013 | Grodzki | G01R 33/4816 |
| | | | 324/309 |
| 2013/0271135 A1* | 10/2013 | Ozen | G01R 33/543 |
| | | | 324/309 |
| 2014/0046171 A1 | 2/2014 | Schmidt | |
| 2014/0084924 A1 | 3/2014 | Grodzki | |
| 2015/0065854 A1* | 3/2015 | Ahn | A61B 6/5247 |
| | | | 600/411 |
| 2015/0153431 A1* | 6/2015 | Hancu | G01R 33/4816 |
| | | | 324/309 |

OTHER PUBLICATIONS

Rahmer et al.: "Assessment of Anterior Cruciate Ligament Reconstruction Using 3D Ultrashort Echo-Time MR Imaging"; Journal of Magnetic Resonance Imaging; vol. 29; pp. 443-448; ( 2009;).

* cited by examiner

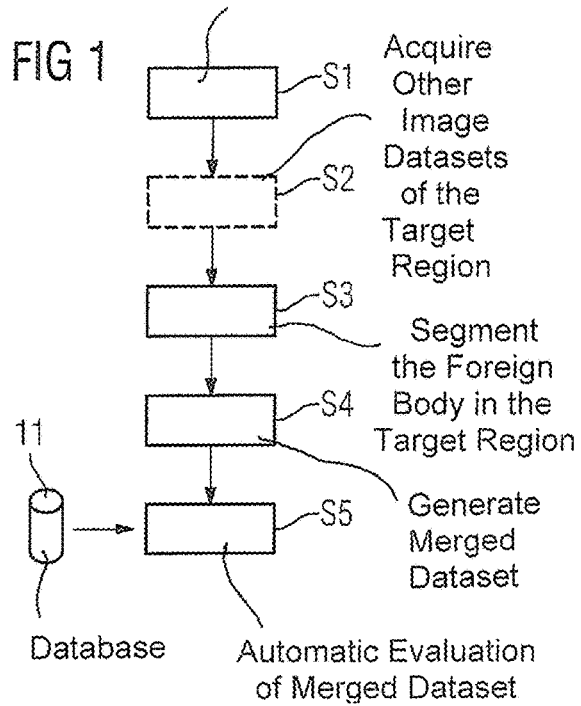
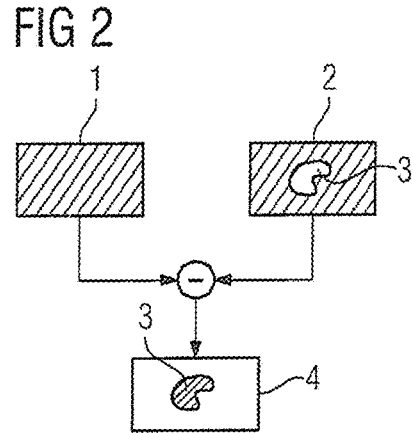
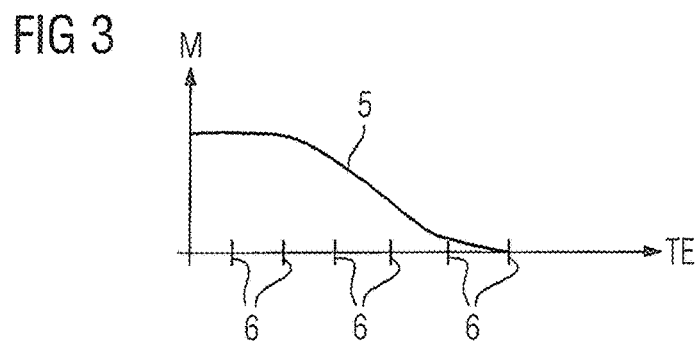

METHOD AND APPARATUS FOR RECORDING A MAGNETIC RESONANCE DATASET OF AT LEAST ONE FOREIGN BODY IN A PATIENT

BACKGROUND OF THE INVENTION

Field of the Invention

The present invention concerns a method for recording a magnetic resonance dataset of at least one foreign body in a target region of a patient, as well as and to a magnetic resonance apparatus designed to implement such a method.

Description of the Prior Art

In surgical procedures, foreign bodies may be introduced into a patient. While implants are a classic example of such foreign bodies, glues, fillings, foreign-material fastenings, cementations and other, possibly functional, medical devices must also be mentioned. If such a foreign body is introduced into a patient or produced in the patient, complications often occur, for example rejection reactions by the body, infections or mechanical faults leading to the loss of the structural integrity and/or the functionality of the foreign body. For example, cemented implants may not integrate correctly in the relevant bones or may fail by becoming detached after successful implantation. Polymeric fastenings, glues and cements may become defective due to degradation over time, for example crack formation and such like. Biodegradable devices such as retaining screws may fail in their intended function due to inflammatory responses in patients or to breakage. In order to be able to intervene in good time in such a case of failure, for example in order to prevent irreparable damage, accurate detection and characterization of the functional state of the foreign body is necessary.

For application cases of this kind, in which a non-invasive evaluation of the foreign body, for example an implant, is desirable, imaging modalities such as computed tomography and ultrasound are less suitable, because image artifacts often occur, the contrast is unsuitable and inflammations or such like do not become visible. In principle, magnetic resonance imaging is therefore an obvious choice as an imaging modality, since it provides high signal and contrast resolution of soft tissues and bones, but it has not been capable of visualizing the integrity of foreign bodies, for example solid implants and fastening components. Magnetic resonance imaging normally cannot be used because the magnetic resonance signal has already decayed before the current magnetic resonance sequences could measure it. In addition, pronounced image artifacts can occur, because metallic foreign bodies, in particular, can distort the fields of the magnetic resonance scanner that are necessary for measurement, due to their susceptibility effects. While magnetic resonance sequences that reduce these artifacts and permit imaging of the tissue around the foreign body have become known, no method for imaging the foreign bodies themselves, which is suitable for extensive clinical practice, has yet become known.

SUMMARY OF THE INVENTION

An object of the invention is to provide a way of making foreign bodies, in particular implants and the fastenings thereof, visible with the highest possible quality in magnetic resonance imaging, so as to enable evaluation of whether they are fulfilling their function, of cases of failure, and/or of other difficulties relating to their use.

This object is achieved by a method is provided according to the invention for recording a magnetic resonance dataset of at least one foreign body in a target region of a patient that uses a magnetic resonance sequence having an ultra-short echo time, which is less than 500 µs.

Preferably, echo times in the range from 20 is to 100 µs are used. The invention provides a way, based on magnetic resonance imaging with ultra-short echo times, of directly recording and evaluating a foreign body, in particular an implant, a medical device and/or a fastening. Of course, the foreign bodies must always contain nuclei that can be captured by magnetic resonance imaging, in particular i.e. hydrogen (bound protons). Many foreign bodies that are introduced into patients have strongly bound protons: polymers, cements, glues and biodegradable devices and fastenings, for example usually embody such bound protons. The strong bond of these protons results in the magnetic resonance signal decaying very rapidly, and the foreign bodies not being visible by conventional magnetic resonance imaging, i.e. using conventional magnetic resonance sequences. This problem is resolved by use of magnetic resonance sequences having ultra-short echo times.

The magnetic resonance signal that is measurable in magnetic resonance imaging decays with the relaxation constant T2 or T2*. The magnetic resonance signal decaying with T2* is also referred to as the "free induction decay signal—FID signal". For soft tissue, which is normally recorded by magnetic resonance imaging, these relaxation times normally are significantly above 10 ms, whereas strongly bound protons in solid structures, such as for example foreign bodies, have significantly shorter T2 and T2* relaxation times, for example significantly below 1 ms down to several µs.

In magnetic resonance imaging, the magnetic resonance data at the center of k-space are recorded (entered into k-space) at the so-called echo time (TE). Magnetic resonance sequences used in routine magnetic resonance imaging normally have echo times in the range from 2 to 100 ms. Signals with T2 or T2* that are significantly shorter than the echo time are then not visible in the magnetic resonance scan. Certain magnetic resonance sequences, such as the UTE sequence ("ultrashort TE") or PETRA ("pointwise encoding time reduction with radial acquisition", cf. D. Grodzki et al., Magn. Reson. Med. 67 (2012) 510-518), permit so-called ultra-short echo times, where TE is less than 500 µs, for example between 20 and 100 µs. Unlike in conventional magnetic resonance sequences, in magnetic resonance sequences with ultra-short echo times no echo is formed; rather the magnetic resonance data are recorded already during the FID. In this way, strongly bound protons in foreign bodies in a patient also become visible.

Foreign bodies introduced into patients, for example, implants for joint replacement, cements, glues, fastenings and biodegradable devices, contain strongly bound protons. According to the invention, these protons are measured using magnetic resonance sequences with an ultra-short echo time, so that for example, damage, faulty arrangements and the like can be located. The target region, i.e. the "region of interest—ROI", containing the foreign body is measured using the magnetic resonance sequence with an ultra-short echo time, after which within the scope of the invention further evaluations can follow. Thus it is possible to detect early and non-invasively in vivo cases of failure relating to introduced foreign bodies, in particular implants.

As mentioned, within the scope of the invention, a UTE sequence and/or a PETRA sequence can be used as a sequence. Of course, the use of other magnetic resonance sequences with ultra-short echo times is also conceivable.

The foreign body has, as noted, strongly bound protons, so it can also be said that it contains protons that have a T2 and/or T2* relaxation time of less than 1 ms.

In a further embodiment of the present invention, as part of an evaluation of the magnetic resonance data, the foreign body is segmented. To this end, for example a suitable segmentation algorithm can be used that evaluates the magnetic resonance data that have already been recorded in such a way that this segmentation is easily possible, whereby due to the specific properties of the foreign body, those parts of the magnetic resonance dataset that have a rapidly decaying magnetic resonance signal are identified. The appropriately segmented portion that describes the foreign body can be used for further evaluation. Within the scope of the method according to the invention, two specific embodiments of magnetic resonance measurement are preferred, which supply data that are excellently prepared for segmentation, both having in common the fact that the foreign body is segmented using the T2* relaxation times as a threshold value for pixels below the T2* relaxation time.

Thus, in order to quantitatively determine the T2* relaxation time, multiple echoes are measured at different echo times, in particular after a single excitation pulse. In this way, it can be determined at what time and how far the magnetic resonance signal at a pixel has decayed, so that from the various measurement times described by the different echo times the T2* relaxation time of the pixel can be concluded. Thus in one evaluation step, the magnetic resonance data recorded at various echo times is evaluated in order to obtain for the various pixels a quantitative value of the T2* relaxation time which can be checked against the threshold value as part of a threshold value segmentation. Refinements of the segmentation algorithm are of course also in principle conceivable.

It should be noted that the relevant procedure leads to quantified T2* values for each pixel, thus a T2* map is determined even at this evaluation stage that forms the basis of segmentation, which map can also be taken into account at subsequent times as part of further evaluations, which will be explained in even greater detail.

In a preferred specific embodiment of magnetic resonance measurement in order to be able to perform a segmentation of the foreign body in a simplified manner, as part of the magnetic resonance sequence, a saturation pulse having a duration of at least 25 ms, preferably at least 30 ms, is radiated before the excitation pulse, so that the signal from proton spins lying outside the foreign body and exceeding the threshold value for the T2* relaxation time is saturated. By virtue of the fact that in the region of the foreign body, due to the short T2 and T2* times, an extremely fast signal decay takes place, the relevant spins do not reach saturation but are only somewhat excited, whereupon the excitation quickly decays again, and such like. This means that after the saturation pulse the measurement can be made after just a short waiting time for relaxation of the slight excitation, whereas the spins with long T2 or T2* relaxation times are in saturation and deliver no signal at all. In this embodiment, it is therefore possible for only the magnetic resonance signal of the foreign body will be measured, which may simplify segmentation.

It should also be noted that in the embodiment with a measurement at various echo times, a similar image can also be generated by making a second measurement at a significantly later second echo time, the magnetic resonance signals of the foreign body having at the time of the second measurement long since decayed. If one then removes from the magnetic resonance image of the magnetic resonance dataset produced in the first measurement at the ultra-short echo time, the magnetic resonance image of the magnetic resonance dataset recorded at the second echo time in the second measurement, a magnetic resonance image is also obtained that contains only the portions of the foreign body, so that here, too, segmentation is easy.

While the automatic segmentation of the foreign body already constitutes a first useful evaluation of the magnetic resonance data, further automated evaluation steps can be implemented within the scope of the present invention. Thus, in a further embodiment of the invention, as part of an evaluation of the magnetic resonance data, a quantification of the T2* relaxation time and/or the proton density as evaluation variables is carried out, in particular a determination of an evaluation variable map for the target region. As has already been shown, quantification of the T2* relaxation time can already be carried out as part of the segmentation, if T2* relaxation times are explicitly determined for each pixel from which magnetic resonance data was recorded at different echo times. In general, the T2* relaxation times are determined by an evaluation of magnetic resonance data measured at different echo times, where for example, regression methods and such can be applied. With regard to proton densities, these can be determined by comparisons with regions of known proton density, a specific type of tissue. Such may be possible where the area around the foreign body is already well known and therefore proton densities in areas surrounding the foreign body, for example in muscle tissue, are already well known, so that conclusions can also be drawn as to the proton density in the foreign body.

With such evaluation variables, in particular T2* relaxation times, which are available as a map, thus for each pixel, a large number of automatic and manual further evaluation procedures can be carried out. Thus, for example, it can be seen from a T2* map where higher T2* times than expected in the foreign body occur, which is an indication of a crack or another structural integrity defect. Thus deviations in these evaluation variables can show damage to the foreign body or an infection. It is thus possible to identify even small deviations, so that a problem can be identified even at an early stage of damage, infection or the like, so that appropriate remedial procedures can be implemented. Thus, generally speaking, it can be provided that at least one item of structural integrity information is determined by evaluating the evaluation variables in the foreign body, in particular by comparing with target values and/or by analyzing the distribution of the evaluation variables. If, for example, significantly longer T2* values occur in an area of the foreign body, it can be assumed that either the protons are not so strongly bound or that free water protons are present. In both cases, this may indicate damage, for example cracks or the like, to the foreign body, for example an implant.

In many clinical applications it is known in advance what type of foreign body is present inside the patient, for example where particular joint replacement parts and the like are used. Also, for example, screws that have been placed are usually already known in advance in terms of their shape and their properties, the same also applying to many other examples. In the case of fillings or other foreign bodies, prior knowledge may also exist from a treatment plan or a verification scan after the foreign body has been inserted. There is thus in many cases prior knowledge available which can of course be input into evaluating the magnetic resonance data relating to the foreign body, for example by specifying target values for the T2* relaxation times, proton densities and the like. If, however, the foreign bodies are implants or other firmly predefined devices inside the patient, a particularly useful embodiment of the invention provides that target values, in particular for foreign body parameters describing the foreign body and available as prior knowledge, are determined from a database. For example, the expected magnetic resonance signal, in particular the T2* relaxation times and/or the proton densities and/or the measured magnetic resonance signal itself, the shape and the structure of the undamaged foreign body can be stored in a database of this type. If a relevant implant is available, the target values can be retrieved, for example as a target dataset. An automatic evaluation algorithm can then be provided which compares the measured data with the target value dataset and identifies possible damage.

In a further embodiment of the inventive method, at least one image dataset of the target region is recorded by magnetic resonance imaging, and from image data of the image dataset and magnetic resonance data of the magnetic resonance dataset, a merged dataset is generated and displayed. In the process, of course, both the image data and the magnetic resonance data can be at least partially pre-evaluated in order to be entered into the merged dataset. Thus, in a preferred exemplary embodiment a representation of the foreign body obtained by segmentation, in particular in accordance with the procedures described previously, is overlaid on the image data set. The magnetic resonance data can thus be merged with image data, in particular with image data from conventional magnetic resonance imaging. For this purpose, for example, a weighting can be applied and/or the segmented foreign body can be displayed, preferably as an overlay. This makes it possible not only to be able also to identify anomalies, for example, inflammations, in the surrounding tissue but also, if artifacts or distortions due to the foreign body occur in the conventional image dataset recorded by magnetic resonance imaging, to detect how closely the distortions/artifacts lie to the foreign body, for example an implant.

As described above, in foreign bodies containing metal or foreign bodies generating otherwise for example a jump in susceptibility to the tissue, artifacts/measurement errors may occur, as although magnetic resonance sequences with ultra-short echo times are extremely insensitive to susceptibility artifacts, artifacts or signal losses may arise due to dephasing and/or frequency shifts. In a further embodiment, in the case of a foreign body containing metal, correction of the interfering fields that arise due to the metal is made during the measurement. As emphasized, an important objective within the scope of the present invention, is to measure the protons in the foreign body itself that are located close to the metal and thus may often also exhibit faults. Additional steps are thus proposed so that these protons in the foreign body can nonetheless be measured.

Thus, gradients induced by the metal can be compensated for by compensation gradient pulses and/or the excitation frequency can be adapted based on basic field deviations in the target region, particularly in the foreign body. The two effects that are primarily still relevant also for measurements with ultra-short echo times are, first inhomogeneities of the main magnetic field, which can be read for example from a basic magnetic field map that can be recorded using known methods (B0 field or basic field measurement), and second dephasing effects due to additional gradient moments that occur due to the magnetic gradient of the metal. A changed basic magnetic field shifts the Larmor frequency, thus also the excitation frequency, so that the excitation frequency of the excitation pulse can then be adapted. To compensate for additional gradient moments, appropriate compensation gradient pulses can be included in the magnetic resonance sequence. While these techniques are basically known in the prior art, they have until now not been applied in respect of ultra-short echo times, as these were used for measuring tissue, so the measurement has shown itself to be quite robust in countering these effects.

If the effects occurring due to the metal in the target region are too varied, the measurement can be carried out as sub-measurements of different sub-regions of the target region with differing impacts of the metal. This means that it is possible that the previously described compensation/correction mechanisms are effective only for particular sub-regions, in which influences by the metal occur, so that the measurement can be repeated several times for different sub-regions of the target region, whereupon in a following step the various partial measurements relating to the magnetic resonance data can be combined.

In summary, the inventive method thus provides procedure for acquiring data about foreign bodies in a patient, in particular about implants, cementations, glues, fastenings and other medical devices, in which magnetic resonance data are recorded with a magnetic resonance sequence with ultra-short echo time. Embodiments of the method provide for the automated segmentation of the foreign body, the automatic comparison of evaluation results with target values of a database, die automatic identification of possible damage by automatic evaluation, merger with clinical image datasets of other contrasts, the evaluation of quantitative dimensions, for example of T2* values, in and around the foreign body for detecting anomalies and correcting distortion effects of the metal on the magnetic fields of the magnetic resonance device.

The invention also concerns a magnetic resonance device which has a control device designed to implement the inventive method. The control device thus has in particular a recording unit which controls the other components of the magnetic resonance device in order to record the magnetic resonance data with the magnetic resonance sequence using an ultra-short echo time. Further possible components of such a control device are a segmentation unit, an evaluation unit, a merging unit and the like. All embodiments relating to the inventive method are applicable to the inventive magnetic resonance device, with which the aforementioned advantages can thus also be obtained.

BRIEF DESCRIPTION OF THE DRAWINGS

FIG. 1 is a flowchart of an exemplary embodiment of the inventive method.

FIG. 2 is a diagram for explaining an embodiment preparing a segmentation.

FIG. 3 is a diagram for explaining measurement at several echo times.

DESCRIPTION OF THE PREFERRED EMBODIMENTS

Figure 4:
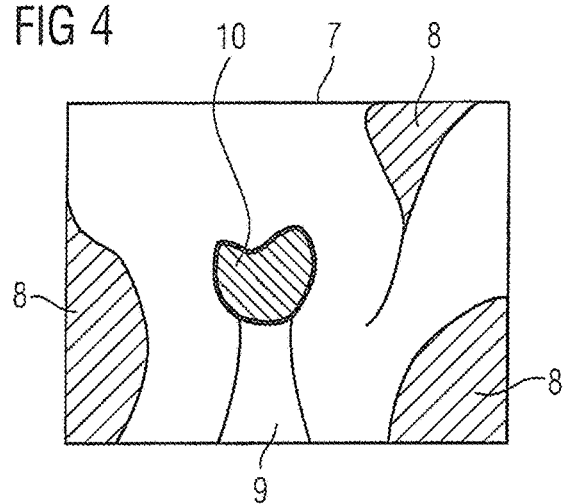
FIG. 4 shows an overlay of an image dataset showing the anatomy with magnetic resonance data.

FIG. 1 IS a flowchart of an exemplary embodiment of the inventive method which is for recording and evaluating magnetic resonance data of a foreign body in a target region of a patient, in the specific example of an implant. Here, not only is magnetic resonance data of the implant itself, for example of a replacement joint, to be recorded, but also an automatic evaluation carried out with regard to the functionality and structural integrity of the implant and influence on its surroundings. Of course, this description also applies to other foreign bodies, for example cements, fastenings, glues, screws, and other medical devices.

In a step S1 the magnetic resonance data are recorded with a magnetic resonance scanner, a target region of the patient containing the implant being selected as the coverage area. A magnetic resonance sequence is used which permits ultra-short echo times, here in the range from 20 μs to 100 μs, i.e. the first measurement of magnetic resonance data takes place at an extremely early echo time, so that even rapidly decaying magnetic resonance signals like those generated by the strongly bound protons in the implant can reliably be captured. Nonetheless, magnetic resonance data are also recorded at several later echo times, ideally after a single excitation pulse, but optionally also in several runs through the magnetic resonance sequence in order to simplify the segmentation of the implant during the subsequent evaluation and to be able to determine T2* relaxation times.

Optionally, in step S1 the excitation pulse may be preceded by a saturation pulse that lasts at least 25 ms, in the present case 30 ms, and bring the spins of the surrounding tissue of the patient, excitation of which decays more slowly, to saturation such that in the magnetic resonance data only those magnetic resonance signals of the implant are measured that have a T2* relaxation time less than a threshold value.

It should be noted, however, that such magnetic resonance data can also be generated without a saturation pulse if two measurements are made at different echo times, as the first, ultra-short echo time shows the signals of all the spins, but in the case of the second echo time of the second measurement the magnet resonance signals with a low T2* relaxation time have already decayed, as FIG. 2 illustrates schematically. In FIG. 2, reference character 1 designates a magnetic resonance image that was recorded at the first ultra-short echo time and thus shows a signal in the entire target region, shown shaded. The magnetic resonance image 2 was recorded at a second, later echo time, for example 5 ms, such that the signal portions of the implant in the region 3 have already decayed and signal is only present in the tissue. If one now deducts, as shown schematically, the magnetic resonance image 2 from the magnetic resonance image 1, a magnetic resonance image 4 emerges, in which signal is only present in region 3 of the implant. This essentially matches the result when one uses a long saturation pulse, as described.

In the present case, however, as already described, magnetic resonance data are also recorded at various echo times after the first ultra-short echo time, so that the decay of the transverse magnetization can be retraced and T2* relaxation times for the individual pixels quantitatively determined, as already indicated by FIG. 3. There, the transverse magnetization is plotted schematically against the echo time in its curve 5, markings 6 representing possible echo times at which magnetic resonance data can be recorded, such that the curve 5 can be reconstructed from these and a T2* relaxation time can be determined in a later step of the inventive method. The image 1 in FIG. 2 could in this case originate from the first measured ultra-short echo time, the image 2 in FIG. 2 from the last measured, longer echo time in FIG. 3, at which the magnetic resonance signal in the implant has already decayed.

If the implant has metal, data recording in step S1 can be modified in order to compensate for field distortions or additional gradient moments occurring due to susceptibility jumps. To this end, for example, a basic magnetic field map (often also referred to as a B0 map) can be generated in a known manner, whereupon the excitation frequency can then be adapted according to a deviation of the main magnetic field, it being entirely possible to measure the whole target region in several sub-regions and then to join the corresponding partial measurements to form an overall image. To correct additionally occurring gradient moments, additional compensation gradient pulses can be switched, as is basically known in the prior art, but has not yet been used for the magnetic resonance sequences with a short echo time which are basically robust against such interferences, since the subject of data capture has not previously been an implant containing metal or another foreign body.

In an optional step S2, anatomical image datasets of the target region, which in this case are required to be registered with the magnetic resonance dataset obtained in step S1, can also be recorded with the same magnetic resonance device using conventional magnetic resonance sequences.

In a step S3, the implant is segmented in the magnetic resonance data. If a saturation pulse was used as a preliminary pulse, as described above, so that the measured magnetic resonance signals originate only from the implant, common threshold value segmentations in the magnetic resonance data itself can be used in order to enable segmentation. However, it is also (or additionally) conceivable even at this time, i.e. in step S3, as has been described, to determine a T2* relaxation time map automatically, once, as has been described in relation to FIG. 3, magnetic resonance data at several echo times is available from which the T2* relaxation time can be recalculated. The segmentation can then be carried out for each pixel, by checking whether the latter lies below a threshold value for the T2* relaxation time.

The result of the automatic segmentation procedure of step S3 is thus implant location and shape information and, in addition, ideally also a T2* relaxation time map.

In a step S4a merged data set is finally generated in which image data of either an image dataset to be registered with the magnetic resonance dataset or else preferably of the image dataset recorded in step S2 is merged with the magnetic resonance data, in order to be able to show the implant, and where applicable its properties, in the context of the surrounding anatomy. Such a merged image 7 of such a merged dataset is shown schematically in FIG. 4. A representation of the anatomy 8, in particular of a bone 9, together with an overlaid representation of the implant 10, can be seen clearly. The merged image 7 can be displayed and used for further manual evaluation.

Figure 5:
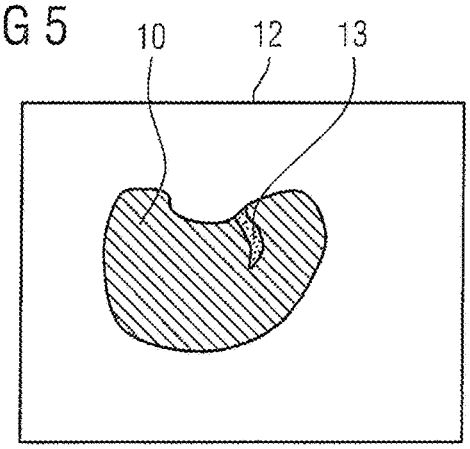
FIG. 5 is a T2* relaxation time map.

However, in a step S5, cf. again FIG. 1, a further automatic evaluation of the magnetic resonance dataset takes place. If a T2* relaxation time map has not already been determined in step S3, this can now also be done in step S5; it is additionally possible, if information about the surrounding, as well as present anatomy is available, to determine from their known classification also quantitative values for the proton density in the implant 10. Since in the present case an implant 10 is being examined for which prior knowledge exists, this prior knowledge is now used in step S5 to call up a target value dataset from a database 11, which is assigned to the prior knowledge and includes target values, for example, for the magnetic resonance data of the implant 10 itself, the T2* relaxation times, the proton densities and/or the distribution of the aforementioned evaluation values. In this way, through automatic comparison with the target values, it can be established whether deviations are present which point to fault states, for example damage to the structural integrity of the implant 10, an incorrect arrangement of the implant 10 or an incorrect shape of the implant 10 and such like. If parallel anatomical image data, recorded for example in step S2, are also available, target values can also relate to this data in order for example to be able to identify anomalies in the surrounding tissue.

Where applicable, structural integrity information about the implant 10 may, however, also be derived for example from the T2* relaxation time maps even without target values, FIG. 5 showing an example of such a T2* relaxation time map 12 for the implant 10. It can be seen that the T2* relaxation times are lower in the region of a crack 13 in the implant 10, either because there is a looser bonding of the protons or because water or such like has already penetrated the implant 10. Other types of anomalies can also be identified by means of such a homogeneity and structural inspection. In this way, damage, for example, can be detected early.

On the whole, therefore, a non-invasive in-vivo evaluation of the condition of foreign bodies, in particular of an implant 10, in the body of a patient is possible, which can be supported by a largely automated evaluation.

Figure 6:
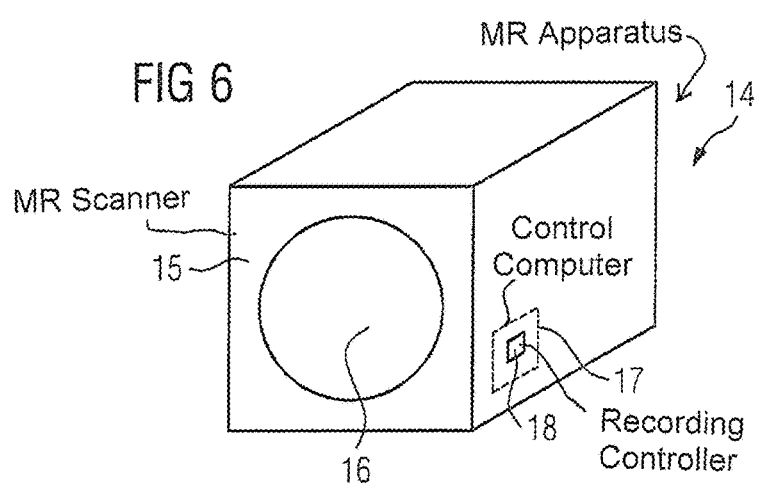
FIG. 6 schematically illustrates an inventive magnetic resonance apparatus.

FIG. 6 is a schematic diagram of an inventive magnetic resonance apparatus 14. The apparatus 14 has a scanner 14 that has a basic magnet unit, which defines a patient opening 16, surrounding which (not shown in detail for clarity) are a gradient coil arrangement and a radio-frequency coil arrangement, and into which a patient can be moved by a patient table. The operation of the magnetic resonance apparatus 14 is controlled by a control computer 17, which is designed to implement the method according to the invention. For this purpose, the control computer 17 has a recording controller 18, which can trigger the other components of the magnetic resonance device 14 so as to record (acquire) the magnetic resonance data in step S1 (cf. FIG. 1). Furthermore, but not shown in detail here, a segmentation unit may be provided for implementing step S3, a merging unit for implementing step S4 and an evaluation unit for implementing step S5. The database 11 may be stored in a storage device of the control computer 17, or can be accessed by the control computer 17, the database 11 may be accessed via a network connection, or the like.

It is also possible to implement parts of the method according to the invention outside of the magnetic resonance apparatus 14, for example on special evaluation computer devices on special evaluation workstations.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data, comprising:
    operating an MR scanner, in which a patient containing a foreign body is situated, said foreign body containing protons having at least one of a T2 relaxation time that is less 1 ms, and a T2* relaxation time that is less than 1 ms, so as to acquire MR data from a target region of the patient that includes said at least one foreign body so that said MR data include MR data acquired from the foreign body, using a magnetic resonance sequence having an ultra-short echo time that is less than 500 μs; and
    providing the acquired MR data to a processor and making the acquired MR data available in electronic form at an output of the processor as a data file.

2. A method as claimed in claim 1 comprising operating said MR scanner with said magnetic resonance sequence selected from the group consisting of a UTE sequence and a PETRA sequence.

3. A method as claimed in claim 1 comprising, in said processor, reconstructing an image of said target region from the acquired magnetic resonance data in said data file and automatically segmenting said foreign body in said image.

4. A method as claimed in claim 1 comprising segmenting said foreign body using a T2* relaxation time of protons in the foreign body as a threshold value, to segment said foreign body as comprising pixels exhibiting a T2* relaxation time that is below said threshold value.

5. A method as claimed in claim 4 comprising quantitatively determining said T2* relaxation time in said processor by measuring multiple echoes with different echo times, after a single excitation pulse.

6. A method as claimed in claim 5 comprising operating said MR scanner in said MR sequence to generate a saturation pulse having a duration of at least 25 ms before said excitation pulse, causing signals from protons outside of said foreign body, and exceeding said threshold value, to be saturated.

7. A method as claimed in claim 1 comprising, in said processor, automatically evaluating said magnetic resonance data based on an evaluation variable selected from the group consisting of a T2* relaxation time represented by the magnetic resonance data, and a proton density represented by said magnetic resonance data.

8. A method as claimed in claim 7 comprising evaluating said magnetic resonance data by generating a map of said evaluation variable in said target region.

9. A method as claimed in claim 7 comprising determining said T2* relaxation time as said evaluation variable by evaluating said magnetic resonance data acquired at respectively different echo times.

10. A method as claimed in claim 7 comprising determining said proton density as said evaluation variable by comparing the proton density in said target region with regions of a predetermined tissue type having a known proton density.

11. A method as claimed in claim 7 comprising, in said processor, determining at least one item of structural integrity information by said evaluation of said evaluation variable in said foreign body by comparison of said evaluation variable with a target value or by analyzing a distribution of said evaluation variable in said foreign body.

12. A method as claimed in claim 11 comprising, from said processor, accessing a database to obtain said target value or to obtain a predetermined distribution of said evaluation variable.

13. A method as claimed in claim 1 comprising, in said processor, converting said data file into image data and reconstructing an image of the target region from said image data and, from said processor, causing said image to be displayed at a display screen in communication with said processor.

14. A method as claimed in claim 13 comprising, in said processor, automatically segmenting a representation of said foreign body, and overlying said segmentation of said foreign body on said image at said display screen.

15. A method as claimed in claim 1 wherein said foreign body contains metal that produces an interfering field during acquisition of said magnetic resonance data, and operating said MR scanner to compensate said interfering field during said acquisition of said magnetic resonance data.

16. A method as claimed in claim 15 wherein said interfering field comprises a field gradient, and compensating for said interfering field by operating said MR scanner to generate a compensation gradient pulse that compensates said gradient field of said interfering field.

17. A method as claimed in claim 15 comprising operating said MR scanner to compensate said interfering field by adapting an excitation frequency used to excite nuclear spins in said target region dependent on deviations of a basic magnetic field in said MR scanner produced by said interfering field.

18. A method as claimed in claim 13 comprising operating said MR scanner to acquire said magnetic resonance data in a plurality of partial measurements wherein, in each partial measurement, magnetic resonance data are acquired from a different sub-region of said target region, with each of said sub-regions being respectively differently affected by said interfering field.

19. A magnetic resonance (MR) apparatus comprising:

an MR scanner adapted to receive a patient therein, said patient containing a foreign body therein;

a control computer configured to operate the MR scanner, while the patient containing a foreign body is situated therein, said foreign body containing protons having at least one of a T2 relaxation time that is less 1 ms, and a T2* relaxation time that is less than 1 ms, so as to acquire MR data from a target region of the patient that includes said at least one foreign body so that said MR data include MR data acquired from the foreign body, using a magnetic resonance sequence having an ultra-short echo time that is less than 500 μs; and said control computer being configured to make the acquired MR data available in electronic form at an output of the control computer as a data file.

* * * * *